United States Patent [19]

Boschman

[11] Patent Number: 4,546,951
[45] Date of Patent: Oct. 15, 1985

[54] MOULD FOR ENCAPSULATING PARTS OF ELEMENTS INTO A PLASTIC MATERIAL

[75] Inventor: Everardus H. Boschman, Aerdt, Netherlands

[73] Assignee: Arbo Gereedschapsmakerij B.V., Zevenaar, Netherlands

[21] Appl. No.: 523,748

[22] Filed: Aug. 16, 1983

[30] Foreign Application Priority Data

Aug. 19, 1982 [NL] Netherlands .......................... 8203255

[51] Int. Cl.⁴ .............................................. B29C 6/04
[52] U.S. Cl. ...................................... 249/95; 249/115; 249/135; 264/272.17; 264/338; 425/121
[58] Field of Search ................... 264/272.17, 337, 338; 249/134, 115, 135, 95; 29/588; 425/116, 121

[56] References Cited

U.S. PATENT DOCUMENTS

| 2,364,746 | 12/1944 | Moule . | |
| 3,709,459 | 1/1973 | Bushrod | 249/134 |
| 4,120,930 | 10/1978 | Lemelson | 264/219 |
| 4,368,168 | 1/1983 | Slepcevic | 264/272.17 |

FOREIGN PATENT DOCUMENTS

| 2600780 | 8/1976 | Fed. Rep. of Germany ...... 249/134 |
| 1113760 | 1/1954 | France . |
| 7903254 | 4/1979 | Netherlands . |
| 1261022 | 1/1972 | United Kingdom ............... 249/134 |

Primary Examiner—James Lowe
Attorney, Agent, or Firm—Weiser & Stapler

[57] ABSTRACT

The invention relates to a mould for encapsulating parts of elements into a plastic material to manufacture electric components. The mould comprises a number of steel blocks or rods with accurately finished surfaces for clamping them completely tight together in a holder, whereby recesses in said blocks or rods are forming the mould cavity or mould cavities and the sprues. A layer of high hardness, such as a nitride layer, is deposited by means of vapor deposition in vacuum at a high temperature onto at least those surfaces of said blocks or rods determining the mould cavity or mould cavities and the sprues. Furthermore the blocks or rods are concerning their dimensions and/or flexibility and/or structure and/or finishing of the surfaces turned away from the mould cavity embodied such that deformations in the position in which said blocks or rods are clamped into said holder, caused by the depositioning of said layer, are eliminated.

23 Claims, 5 Drawing Figures

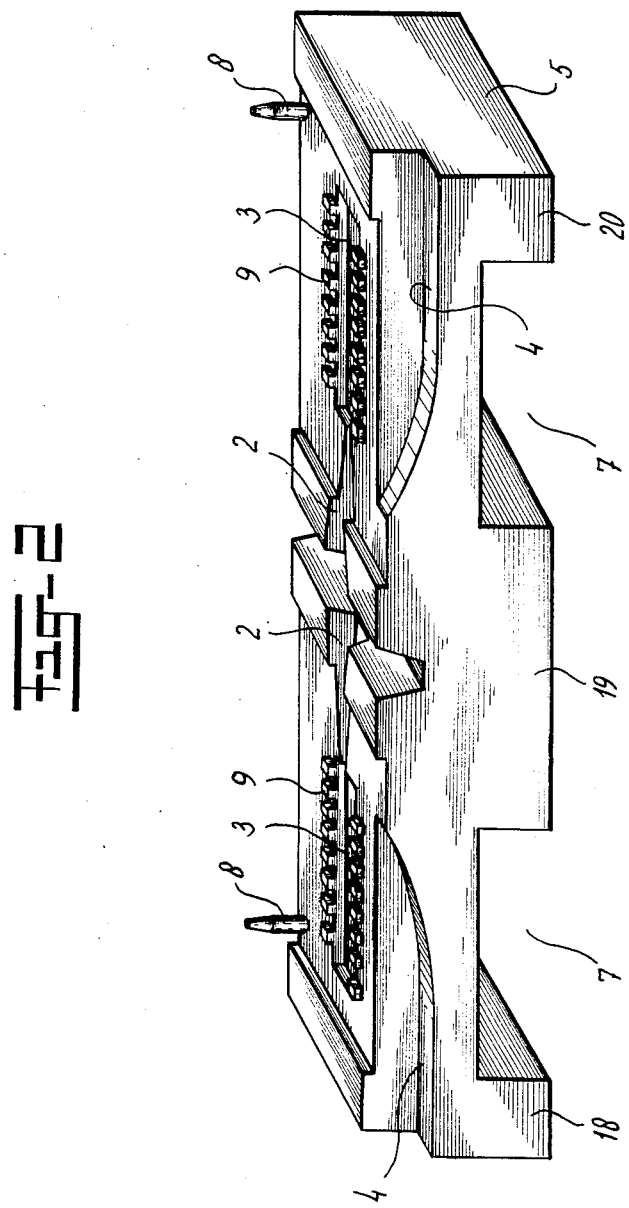

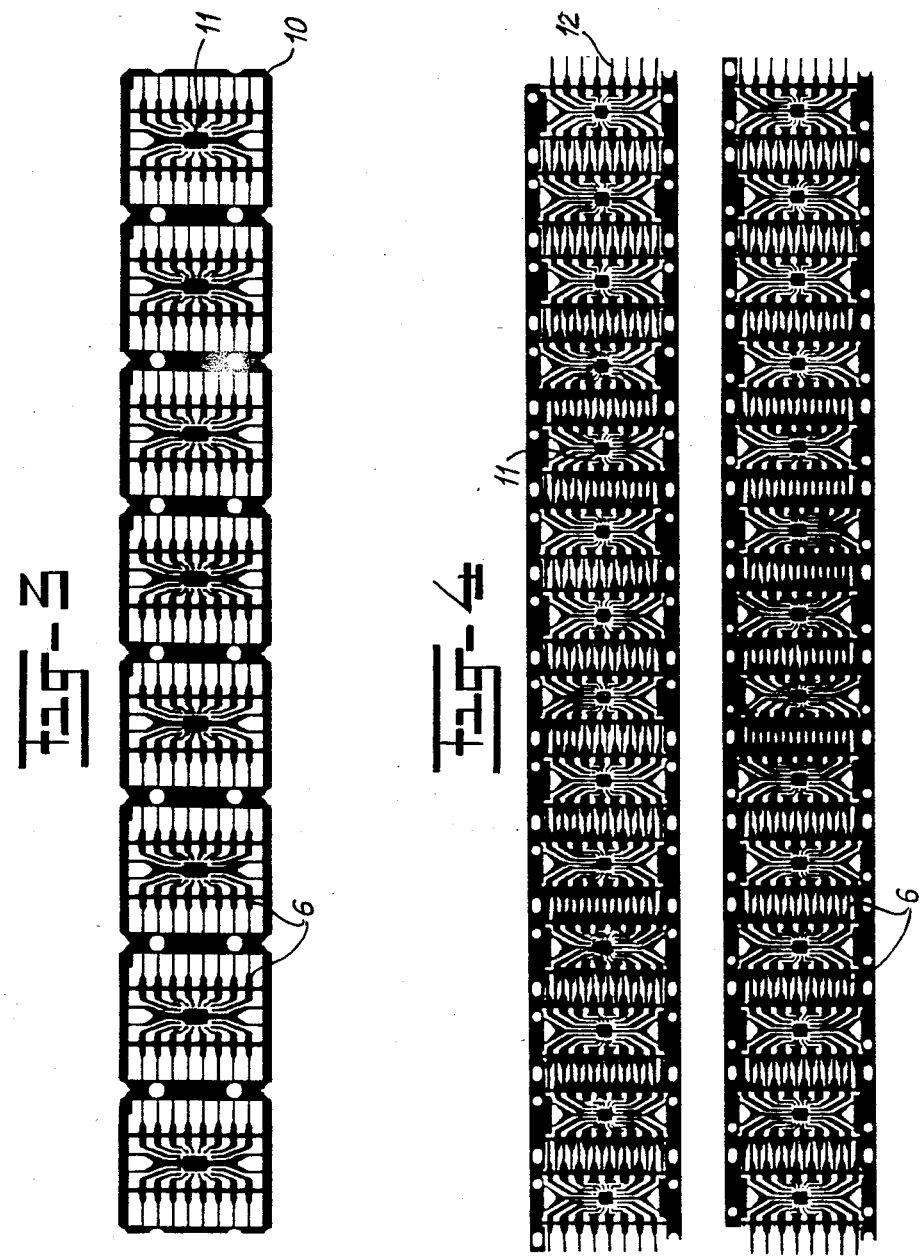

MOULD FOR ENCAPSULATING PARTS OF ELEMENTS INTO A PLASTIC MATERIAL

The invention relates to a mould for encapsulating parts of elements into a plastic material to manufacture electronic components, which mould comprises a number of steel blocks or rods, with accurately finished surfaces for clamping them completely tight together in a holder, in which clamped position recesses in said blocks or rods determine the mould cavity or mould cavities and the sprues, which mould has provisions for releasing the injected plastic material from the mould after hardening of said plastic and after opening of said mould.

Such moulds are known from the prior art and these prior art moulds comprise a number of rods which accurately fitting can be clamped into a holder and which have a large number of mould cavities. Said rods have a length of approximately 200 mm, a height of approximately 15 mm and a width which is varying between 2 mm and for instance 60 mm, said width is dependent of the normalized dimensions of electronic components. The division up into rods or blocks is necessary because otherwise no accurate finishing of the mould cavities is possible, which mould cavities are lapped as smooth as possible. The blocks are very accurately finished to obtain a completely tight closure of the blocks against each other. The fluidized plastic material is not allowed to penetrate between the blocks. Said prior art moulds are very expensive and it is difficult to release the plastic after hardening. The plastic is a thermo hardening plastic which in the moulten condition is injected and hardens inside the mould. Said prior art moulds have very fine and very accurately finished passages for moving release pins there through. It will be clear that the plastic material is not allowed to penetrate into said passages.

There are already a number of different proposals to eliminate the above menntioned disadvantages.

In the Dutch Patent Application No. 77,04937 the electronic elements are enclosed into prefabricated thermoplastic cups, after which the space between the element and the cup is filled with a thermo hardening plastic. After hardening the cup forms an integral part of the obtained component. In this method it is not necessary to use a complicated mould. It is however disadvantageous that additional steps are introduced in the manufacturing of electronic components: the cups have to be fabricated and brought around the electronic element. Furthermore it is very unlikely that such a construction will be effective within the scope of the advancing miniaturisation. With very small elements the hollow space between the case and the component will be so small that the injection of the thermoharding plastic in the cup and the adherence of the cup to the element will become problematical. With increasing dimensional reduction of the component it is not possible to reduce the wall thickness of said cup in the same amount. Furthermore removing the air present inside said cups will become problematrical.

In the European Pat. No. 0 007 762 a mould is described comprising two flat lower and upper mould sections and a central section with openings, comprising the mould cavities. In the upper mould section only channels for injecting the plastic and a few release pins are necessary. The very complicated functioning of this mould, caused by a large number of sections which have to be brought together, is considered as disadvantageous. Also still a number of release pins are used and furthermore the plastic can only be injected in the illustrated mould from the upper side. That means that automation is only possible on a very restricted scale.

An object of the invention is now the provide a mould for encapsulating parts of elements into a thermohardening plastic, which mould is very easy to manufacture, and whereby releasing the encapsulating elements is very easy, so that automation is possible.

In agreement with the invention the above mentioned provisions are now exclusively embodied as a layer of high hardness, such as a nitride layer, deposited by means of vapour deposition in vacuum at a high temperature onto at least those surfaces of the blocks or rods determining the mould cavity or mould cavities and the sprues, which blocks or rods are furthermore concerning their dimensions and/or flexibility and/or structure and/or finishing of the surfaces at the back side of the mould cavity embodied such, that deformations in the position in which said blocks or rods are clamped into said holder, caused by depositing said layer, are eliminated.

The advantages of this mould according to the invention are:
a. the encapsulated elements can be released very easily
b. no release pins are necessary, so that the costs of the mould can be significantly reduced.
c. because the plastic does not anymore adhere to the mould said mould becomes not polluted and therefore does not have to be cleaned which opens the way to automation.

It is remarked that it is known to provide moulds, used with thermoplastic materials, with a hard nitride layer deposited by means of vapour deposition to extend the live of said mould. These moulds are however not suitable for encapsulating electronic parts. The dimensions of electronic components are very small and the requirements to the accuracy of the moulds are significantly higher than in the case of usual moulds for injection mould of thermoplastic or thermohardening material.

By making the mould of a sintered material, for instance sintered steel warpening during the depositioning of the nitride layer is avoided resulting into a mould with very favourable mechanical qualities.

It is also possible to embody the mould such that the blocks or rods adjoining in longitudinal direction have such a small length that dimensional deviations of surfaces determining the mould cavity are within acceptable tolerance limits. The length of said blocks is in that case so small that eventual warpening because of the small length is hardly of any interest.

The mould may have blocks or rods of which the dimensions in length, width and/or height direction are not or only slightly different, so that deformations of the shape caused by the high temperatures during the vapour depositioning of the nitride layer are in all directions approximatrely equal so that warpening is avoided.

Furthermore the rods of the mould can be made flexible, so that warpened rods will be become straightened in the mould clamping device. A possibility therefore is providing the blocks or rods with transverse slots at that side turned away from the surfaces determining the mould cavity.

In combination with one or more of the above mentioned measurements or separate therefrom warpening of the mould during the depositioning of the nitride layer can be restricted by the way in which the mould material is taken out of a piece of rolled steel. It appears the the warpening is minimized in case the direction in which the steel is rolled is perpendicular to the largest dimension of said blocks or rods, for instance perpendicular to the longitudinal direction.

It is known to configurate a mould with one or more series of mould cavities. The adjoining parts comprise in that case each a number of identical sections of the mould cavities and the sprues. Where it is possible often the rows of connecting pins of integrated circuits are aligned to simplify the processing. If however the integrated circuits are mutually positioned such that the connecting pins are interlocking, then the mould cavities have to be dislocated turn and turn. That saves space so that a larger number of elements can be treated in one mould, however the mould itself becomes more expensive.

Within the scope of the invention it is now possible that each mould cavity or each pair of mould cavities is positioned into a separate block with the centerline at a distance for but parallel to the centerline of the mould.

In that case one still has the advantage that the blocks are aligned during machining and finishing. Thereafter the separate blocks are turn in turn rotated over 180° in the plane of the mould cavity so that the mould cavities become mutually dislocated.

That is possible because within the scope of the invention blocks are used having a very small length.

According to a further embodiment the layer provided by vapour depositioning in vacuum is a titanium nitride layer.

The invention will now be explained in more detail with reference to the accompanying drawings in which:

FIG. 2 illustrates a flexible mould block according to the invention.

FIG. 3 ilustrates a strip of material to be treatened, having aligned connecting pins.

FIG. 4 illustrates a strip of material to be treated with mutually interlocking connecting pins.

Figure 5:
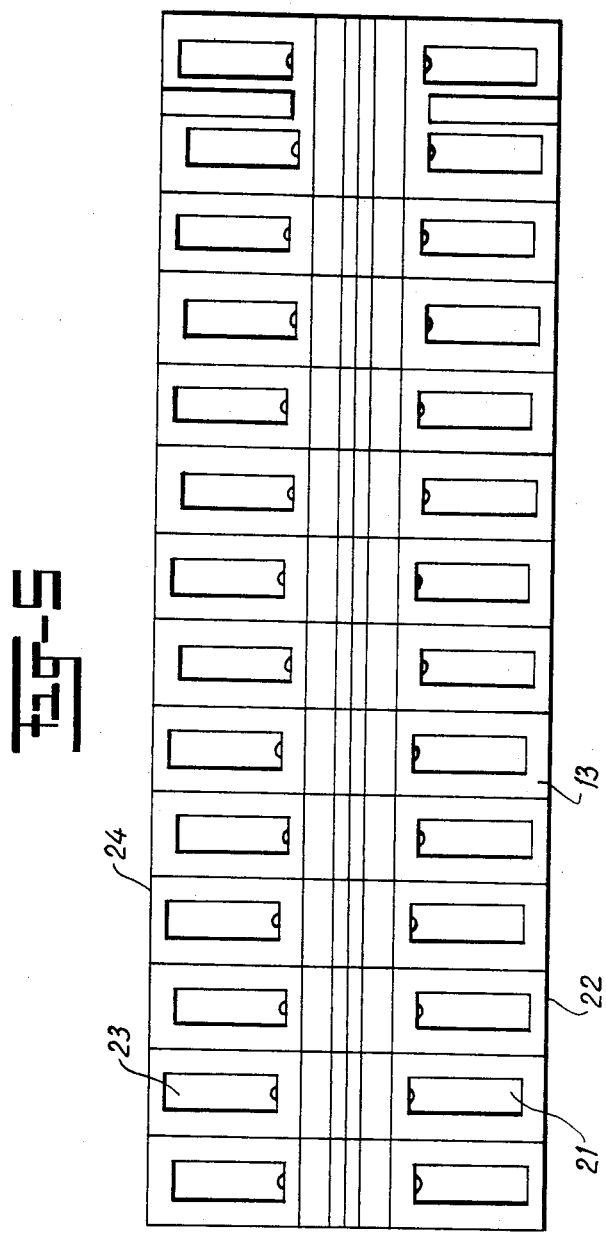

FIG. 5 illustrates the positioning of the mould blocks according to FIG. 2 into a mould for treating a strip as is illustrated in FIG. 4.

Figure 1:
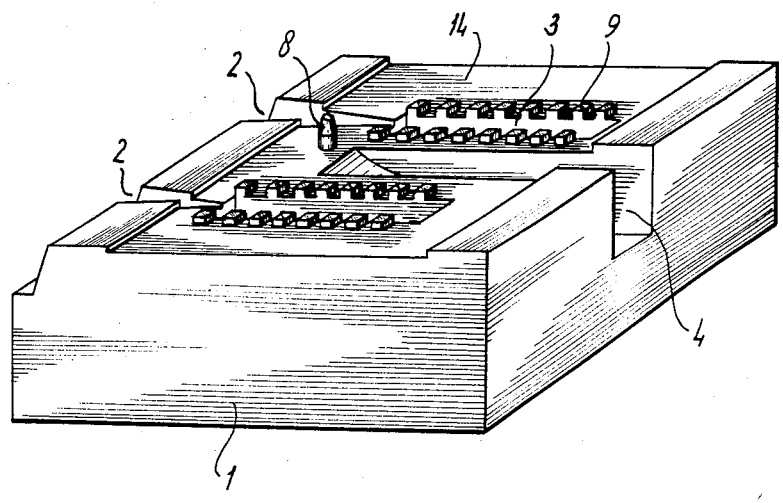
FIG. 1 illustrates a part of the mould according to the invention in a perspective view.

In FIG. 1 the block 1 of a mould is illustrated comprising the sprue 2. Said sprue is in agreement with the copending Dutch Patent Application No. 82,03253 positioned sidelong the mould, however, the sprue can also be positioned at the upper or lower side of the mould. The strip of material with the elements illustrated in FIG. 3 or 4 is placed onto the upper surface 14 of the block 1, whereby the connecting pins of the elements are fitting between the cams 9. It is important that the connecting pins are maintained free of plastic material so that afterwards it is possible to bend the connecting pins of the ready electronic component. Thereafter the (not illustrated) upper block is placed onto said block 1 such that the davel pins 8 of block 1 are fitting into said counterpart. In this upper counterpart only recesses for the uppersection of the electronic elements to be encapsulated are provided. Thereafter the thermo hardening fluid is injected through the sprue 2. After (at least partly) hardening the upper mould blocks are elevated and the treated element or strip of elements can be removed. Because of the presence of the hard titanium nitride layer in the mould cavity and in the sprue the plastic material will release without the use of releasing pins. Because furthermore the adherence of the plastic material is very poor pollution of the mould is prevented so that it is not necessary to clean the mould between the succeeding production steps. The result thereof is that a far reaching automation is possible. As appears from FIG. 1 the illustrated mould block has an approximately square upper surface with a recess 4. The height is smaller than the width respectively the length. Provisions are taken to prevent warpening of the mould when the hard nitride layer is deposited by vapour deposition in vacuum because thereafter the mould cannot be lapped anymore.

Because of the small length, which is for instance 1/10 of the length of known mould blocks, the deformation as a result of the high temperature during the allround depositioning of the hard layer does practically not have any influence.

In FIG. 2 a further embodiment of a mould block according to the invention is illustrated. The significant difference with the mould block illustrated in FIG. 1 is that this mould block has an elongated shape. This mould block has recesses 7 resulting into a flexible mould block. By clamping this mould blocks with their free "legs" 18, 19, 20 onto a flat base surface deformation will be eliminated.

In FIG. 3 a strip of material 10, in general copper with chips 11 and aligned connecting pins 6 is illustrated. In the strip of material illustrated in FIG. 4 the connecting pins 6 are turn and turn dislocated. That results into a shorter configuration so that in each mould a larger number of elements can be treatened.

Finally in FIG. 5 the positioning of the separate mould blocks 13 into a mould destined for treating a strip of material illustrated in FIG. 4 is shown. The separate mould blocks are comparable with the mould block of FIG. 2. By using mould blocks having only one mould cavity or two adjacent mould cavities, which blocks have to be positioned adjacent to each other in longitudinal direction into the mould, the machining and finishing thereof in longitudinal direction becomes very simple.

After machining and finishing the blocks are turn and turn rotated resulting into the configuration which is schematically indicated in FIG. 5.

In each block 13 the mould cavity 21 has a larger distance to the side 22 than the distance from the cavity 23 to the side 24, which difference in distance is determining for the dislocated configuration and therefore is equal to half the distance 12 between the connecting pins 6 of FIG. 4.

I claim:

1. A mould assembly for encapsulating a plurality of electronic components in an encapsulation material, which mould assembly comprises a holder and a plurality of elements made from steel and having accurately finished surfaces such that said plurality of elements fit together within the holder and can be clamped tightly in the holder; wherein each element has a mould cavity for said encapsulating, and sprues for supplying said encapsulation material to said mould cavity; wherein said elements of the mould each have at least on that surface within which the cavity is formed, and including the surface of said cavity, a hardened layer deposited by means of vapour in a vacuum at high temperature; and wherein said elements have a structure and finish such that deformation of each element resulting from the deposition operation is effectively eliminated when said elements are clamped in said holder.

2. A mould according to claim 1, wherein said hardened layer is the only means for releasing said plastic encapsulated components from said mould.

3. A mould according to claim 2, wherein said mould incorporates no release pins.

4. A mould according to claim 1, wherein said hardened layer is a nitride layer.

5. A mould according to claim 4, wherein said nitride layer is a titanium nitride layer.

6. A mould according to claim 4, wherein said elements are made of sintered material.

7. A mould according to claim 1, wherein said elements are a plurality of blocks.

8. A mould according to claim 7, wherein a plurality of said blocks are adjoined in a longitudinal direction in said holder.

9. A mould according to claim 8, wherein the length of said blocks in said longitudinal direction is sufficiently small so that dimensional deviations of the surfaces determining said mould cavities do not develop deformations in said blocks when clamped in said holder.

10. A mould according to claim 9, wherein said blocks are dimensioned so that the length, width and height of said blocks are approximately the same.

11. A mould according to claim 10, wherein said blocks are flexible.

12. A mould according to claim 9, wherein said blocks are elongated, and wherein said elongated dimension is generally transverse to said longitudinal direction.

13. A mould according to claim 12, wherein said blocks are flexible.

14. A mould according to claim 13, wherein said blocks have transverse slots formed in a side of said blocks away from the surfaces determining said mould cavities.

15. A mould according to claim 12, wherein said steel is rolled in a direction perpendicular to said elongated dimension of said blocks.

16. A mould according to claim 1, wherein said mould comprises a plurality of blocks clamped in said holder so that the mould cavities of adjacent blocks are positioned generally along a centerline in said mould.

17. A mould according to claim 16, wherein said components are integrated circuits including a plurality of connecting pins joined end to end in a series.

18. A mould according to claim 16, wherein said mould cavities are offset and positioned at a distance from but parallel to said centerline.

19. A mould according to claim 18, wherein said components are integrated circuits including a plurality of connecting pins and joined end to end in a series, and wherein the connecting pins of adjacent integrated circuits in said series are interlocking.

20. A mould according to claim 19, wherein said offset distance substantially equals one half of the distance between adjacent connecting pins of one of said integrated circuits.

21. A mould according to claim 18, wherein alternating mould cavities are offset from said centerline in opposite directions.

22. A mould according to claim 21, wherein each of said blocks are manufactured with said mould cavities offset in said blocks in the same direction, and wherein adjacent blocks in said series are respectively rotated 180° when clamped in said holder.

23. A mould according to claim 1, wherein said elements are structured and finished such that warp of the elements resulting from the deposition operation is effectively eliminated.

* * * * *